(12) United States Patent
Zhang et al.

(10) Patent No.: US 12,261,108 B2
(45) Date of Patent: Mar. 25, 2025

(54) CHIP HEAT DISSIPATING STRUCTURE, CHIP STRUCTURE, CIRCUIT BOARD AND SUPERCOMPUTING DEVICE

(71) Applicant: Bitmain Technologies Inc., Beijing (CN)

(72) Inventors: Lei Zhang, Beijing (CN); Tao Zhou, Beijing (CN); Tong Zou, Beijing (CN); Micree Zhan, Beijing (CN)

(73) Assignee: Bitmain Technologies Inc., Beijing (CN)

( * ) Notice: Subject to any disclaimer, the term of this patent is extended or adjusted under 35 U.S.C. 154(b) by 881 days.

(21) Appl. No.: 17/327,325

(22) Filed: May 21, 2021

(65) Prior Publication Data
US 2021/0280504 A1 Sep. 9, 2021

Related U.S. Application Data

(63) Continuation of application No. PCT/CN2018/117255, filed on Nov. 23, 2018.

(51) Int. Cl.
*H01L 23/498* (2006.01)
*H01L 23/13* (2006.01)
(Continued)

(52) U.S. Cl.
CPC ........ *H01L 23/49833* (2013.01); *H01L 23/13* (2013.01); *H01L 23/293* (2013.01);
(Continued)

(58) Field of Classification Search
CPC ........... H01L 23/3735; H01L 2924/351; H01L 23/4334; H01L 23/3677; H05K 1/0204; H05K 1/0203; H05K 7/209
See application file for complete search history.

(56) References Cited

U.S. PATENT DOCUMENTS

| 6,724,078 B1 * | 4/2004 | Sur | H01L 23/42 257/E23.09 |
| 7,347,354 B2 * | 3/2008 | Hurley | B23K 31/02 228/221 |

(Continued)

FOREIGN PATENT DOCUMENTS

| CN | 1794445 A | 6/2006 |
| CN | 2862325 Y | 1/2007 |

(Continued)

OTHER PUBLICATIONS

International Search Report for PCT/CN2018/117255 mailed Jul. 2019.

*Primary Examiner* — Jaehwan Oh

(57) ABSTRACT

The present application relates to a chip heat dissipating structure, a chip structure, a circuit board and a supercomputing device, and the chip heat dissipating structure includes a plating layer covered on the chip, where the plating layer includes a first metal layer and a second metal layer arranged in sequence. By adding two metal layer on the top of the chip by physical sputtering, the heat sink may be soldered onto the metal layer through a solder layer, so that the heat sink is fixed to the top of the chip; the main component of the solder layer is metal tin, and the metal layer has a higher thermal conductivity than an epoxy resin material mounted on a traditional heat sink, thereby solving a problem of the heat dissipation bottleneck of a resin material in the chip, thus improving a heat dissipation effect of the chip.

17 Claims, 16 Drawing Sheets

(51) Int. Cl.
*H01L 23/29* (2006.01)
*H01L 23/367* (2006.01)
*H01L 23/373* (2006.01)
*H05K 3/00* (2006.01)

(52) U.S. Cl.
CPC ........ *H01L 23/367* (2013.01); *H01L 23/3736* (2013.01); *H01L 23/49838* (2013.01); *H05K 3/0061* (2013.01); *H01L 2224/97* (2013.01)

(56) References Cited

U.S. PATENT DOCUMENTS

| | | | | |
|---|---|---|---|---|
| 9,142,480 | B2* | 9/2015 | Houle | H01L 23/24 |
| 2002/0105071 | A1* | 8/2002 | Mahajan | H01L 23/36 |
| | | | | 257/E23.101 |
| 2003/0057550 | A1* | 3/2003 | Zhao | H01L 23/49833 |
| | | | | 257/734 |
| 2005/0136640 | A1* | 6/2005 | Hu | H01L 23/373 |
| | | | | 257/E23.102 |
| 2006/0131738 | A1* | 6/2006 | Furman | H01L 23/3737 |
| | | | | 257/E23.087 |
| 2007/0075420 | A1* | 4/2007 | Lu | H01L 24/83 |
| | | | | 257/E23.106 |
| 2007/0238282 | A1* | 10/2007 | Furman | H01L 21/4882 |
| | | | | 438/612 |
| 2009/0057877 | A1* | 3/2009 | Touzelbaev | H01L 21/50 |
| | | | | 257/706 |
| 2010/0157538 | A1* | 6/2010 | Wang | H01L 23/3737 |
| | | | | 165/185 |
| 2010/0302739 | A1* | 12/2010 | Wang | H01L 24/83 |
| | | | | 428/323 |
| 2016/0079203 | A1 | 3/2016 | Xue et al. | |
| 2017/0186665 | A1* | 6/2017 | Choudhury | H01L 23/433 |
| 2018/0190566 | A1* | 7/2018 | Fu | H01L 23/3736 |

FOREIGN PATENT DOCUMENTS

| | | |
|---|---|---|
| CN | 104241219 A | 12/2014 |
| CN | 106935695 A | 7/2017 |
| KR | 20090077202 A | 7/2009 |

* cited by examiner

CHIP HEAT DISSIPATING STRUCTURE, CHIP STRUCTURE, CIRCUIT BOARD AND SUPERCOMPUTING DEVICE

CROSS-REFERENCE TO RELATED APPLICATIONS

This application is a continuation of International Application No. PCT/CN2018/117255, filed on Nov. 23, 2018, which is hereby incorporated by reference in its entirety.

TECHNICAL FIELD

The present application relates to the field of heat dissipation of a chip and, in particular, to a chip heat dissipating structure, a chip structure, a circuit board and a supercomputing device.

BACKGROUND

In current computing devices, a heat sink is usually attached to the top of a chip with thermally conductive glue to dissipate heat for the chip on a circuit board.

However, a thermal conductivity of traditional thermally conductive glue is generally lower than 2 watts/meter·degree (W/(m·C)), resulting in an unsatisfactory heat dissipation effect of the chip.

SUMMARY

The present application provides a chip heat dissipating structure, a chip structure, a circuit board and a supercomputing device to solve the problem that the heat dissipation effect of a current chip is not ideal.

Embodiments of the present application provide a chip heat dissipating structure arranged on a chip, and the chip heat dissipating structure includes a plating layer covered on the chip, where the plating layer includes a first metal layer and a second metal layer arranged in sequence.

Furthermore, the chip heat dissipating structure further includes: a heat sink connected with the plating layer.

Furthermore, the first metal layer is covered on the chip, and the second metal layer is covered on the first metal layer Furthermore, the chip includes a wafer and a plastic encapsulating structure; and the metal layer is covered on the wafer and the plastic encapsulating structure of the chip.

Furthermore, an upper surface of the wafer is exposed.

Furthermore, an area of the plating layer is the same as an area of an upper surface of the chip.

Furthermore, the first metal layer is an alloy metal layer.

Furthermore, a thickness of the first metal layer is 0.1-0.5 microns.

Furthermore, the second metal layer is a copper metal layer.

Furthermore, a thickness of the second metal layer is 2-6 microns.

Furthermore, an area of the first metal layer is the same as an area of the second metal layer Furthermore, the heat sink is soldered to the plating layer through a solder layer.

Furthermore, a solder in the solder layer is tin.

Furthermore, a thickness of the solder layer is 0.1-0.15 millimeters.

Furthermore, an area of the solder layer is the same as an area of the plating layer, or an area of the solder layer is the same as an area of a lower surface of the heat sink.

Furthermore, if an upper surface of the wafer is flush with an upper surface of the plastic encapsulating structure, the plating layer is a plating layer with a uniform thickness:
    if the upper surface of the wafer is lower than the upper surface of the plastic encapsulating structure, the plating layer is embedded in the plastic encapsulating structure; and
    if the upper surface of the wafer is higher than the upper surface of the plastic encapsulating structure, the wafer is embedded in the plating layer Embodiments of the present application further provide a chip structure, including a chip body and the chip heat dissipating structure as described in any one of the above arranged on the chip body.

Embodiments of the present application further provide a circuit board on which at least one of the chip structure as described above is provided.

Embodiments of the present application further provide a supercomputing device in which at least one of the circuit board as described above is provided.

In the above aspects, by providing a chip heat dissipating structure composed of a plating layer, the chip heat dissipating structure is used to be arranged on the chip, and the plating layer is covered on a wafer and a plastic encapsulating structure of the chip, where the plating layer includes a first metal layer and a second metal layer arranged in sequence: furthermore, a heat sink may be connected to the plating layer. Since two metal layers are added on the top of the chip by physical sputtering, the heat sink may be soldered onto the metal layer through a solder layer, so that the heat sink is fixed to the top of the chip: the main component of the solder layer is metal tin, and the metal layer has a higher thermal conductivity than an epoxy resin material mounted on a traditional heat sink, thereby solving a problem of the heat dissipation bottleneck of a resin material in the chip, thus improving a heat dissipation effect of the chip and preventing a large amount of heat from damaging the chip.

BRIEF DESCRIPTION OF THE DRAWINGS

One or more embodiments are exemplified by the drawings. These exemplified descriptions and drawings do not constitute a limitation on the embodiments. Elements with the same reference numerals in the drawings are shown as similar elements, and the drawings do not constitute a limitation in terms of scale, and among them.

| Reference signs: | |
|---|---|
| 1- | Plating layer |
| 2- | Heat sink |
| 3- | First metal layer |
| 4- | Second metal layer |
| 5- | Bottom plate |
| 6- | Dissipating fin |
| 7- | Connecting portion |
| 8- | Wafer |
| 9- | Solder layer |
| 10- | Plastic encapsulating structure |
| 11- | Substrate |
| 12- | Solder ball |
| 13- | Circuit board |

DESCRIPTION OF EMBODIMENTS

Embodiments of the present application are applied to a chip. It should be noted that when a solution of an embodiment of the present application is applied to a current chip or a chip that may appear in the future, names of various structures may change, but it is not affect the implementation of the solutions in embodiments of the present application.

It should be pointed out that terms or wordings involved in embodiments of the present application may be referenced between each other, and will not be repeated.

In prior art, an exposed die package of a wafer refers to exposing the wafer to achieve a goal of better heat dissipation. Among them, a silicon wafer may be referred to as a wafer for short. While the exposed die package is performed, a traditional thermally conductive glue is used to attach a heat sink on the top of the chip, but the thermal conductivity of the traditional thermally conductive glue is generally lower than 2 W/(m·C), which leads to poor heat dissipation of the chip and becomes a heat dissipation bottleneck of a system. In order to achieve a better heat dissipation, a solder with a higher thermal property has become an ideal substitute for thermally conductive glue. The thermal conductivity of the solder is higher than 60 W/(m·C), which can greatly improve the heat dissipation efficiency of the chip. However, the solder cannot be well soldered onto the plastic encapsulating structure of the wafer and the chip.

A chip heat dissipating structure, a chip structure, a circuit board and a supercomputing device provided in the present application aim to solve the above technical problems in the prior art.

In order to a better understanding of features and technical contents of the embodiments of the present application, the implementation of the embodiments of the present application will be described in detail below with reference to the drawings. The attached drawings are for reference and explanation purposes only and are not used to limit the embodiments of the present application. In the following technical description, for a convenience of explanation, a number of details are used to provide a sufficient understanding of the disclosed embodiments. However, without these details, one or more embodiments can still be implemented. In other cases, in order to simplify the drawings, well-known structures and devices may be simplified for display.

Figure 1:
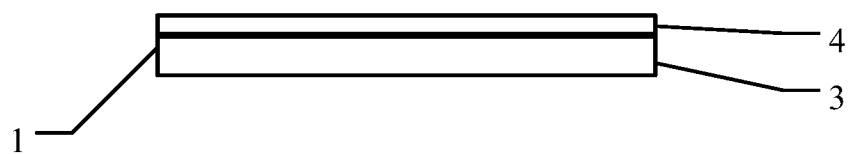
FIG. 1 is a structural schematic diagram I of a chip heat dissipating structure provided by an embodiment of the present application.
Figure 2:
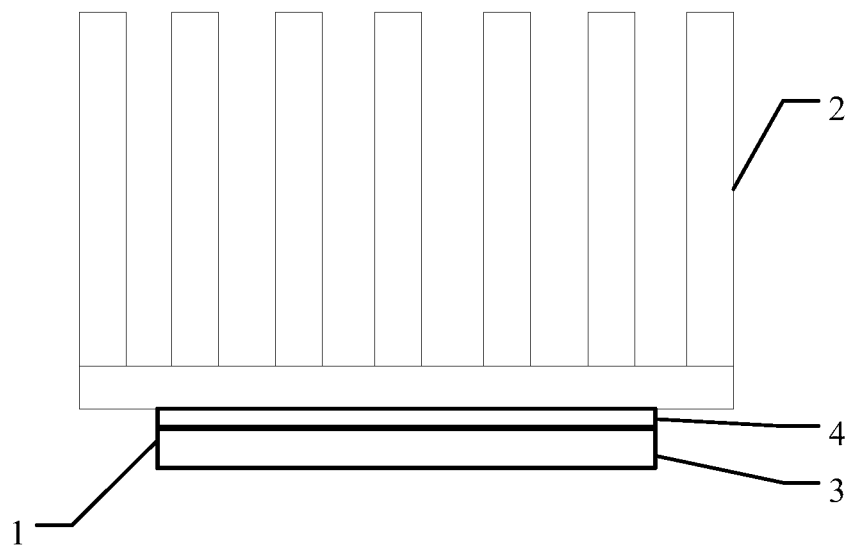
FIG. 2 is a structural schematic diagram II of a chip heat dissipating structure provided by an embodiment of the present application.
Figure 3:
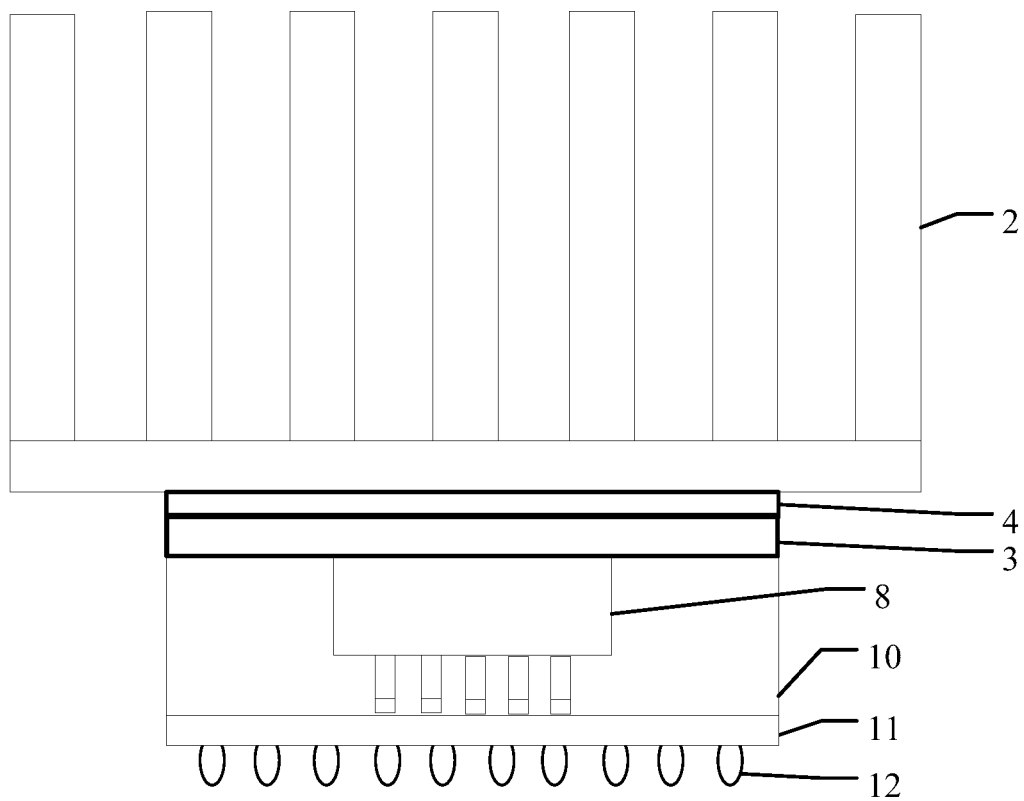
FIG. 3 is a structural schematic diagram III of a chip heat dissipating structure provided by an embodiment of the present application.

FIG. 1 is a structural schematic diagram I of a chip heat dissipating structure provided by an embodiment of the present application: FIG. 2 is a structural schematic diagram II of a chip heat dissipating structure provided by an embodiment of the present application: FIG. 3 is a structural schematic diagram III of a chip heat dissipating structure provided by an embodiment of the present application: as shown in FIG. 1 to FIG. 3, the chip heat dissipating structure is arranged on the chip, and the chip heat dissipating structure includes: a plating layer 1 covered on the chip, where the plating layer 1 includes a first metal layer 3 and a second metal layer 4 arranged in sequence. Exemplarily, the chip heat dissipating structure provided in the present application may be arranged on the chip. Among them, the chip includes a wafer 8, a plastic encapsulating structure 10 and a substrate 11: a groove is arranged on the plastic encapsulating structure 10, and the wafer 8 may be arranged in the groove, and then the plastic encapsulating structure 10 is used to encapsulate the wafer 8 and an upper surface of the wafer 8 is exposed, which is an exposed die structure: the plastic encapsulating structure 10 is fixedly arranged on one side of the substrate 11: furthermore, at least one solder ball 12 may be arranged on the other side of the substrate 11, and the solder ball 12 is used to connect with a circuit board, so as to fix the chip on the circuit board.

As mentioned above, since the solder cannot be well soldered onto the wafer 8 and the plastic encapsulating structure 10 of the chip, in this application, a plating layer 1 is covered on the wafer 8 and the plastic encapsulating structure 10 at the same time to realize a connection of the chip and an external heat sink 2 by soldering.

A shape of the wafer 8 may be a circle, or a rectangle, or a square, or a trapezoid, or other regular shapes, or other irregular shapes: the shape of the wafer 8 is not limited in the present application. A material of the wafer 8 is not limited in the present application either.

A shape of the plastic encapsulating structure 10 is not limited in the present application, as long as the plastic encapsulating structure 10 can realize plastic encapsulation of the wafer 8. A material of the plastic encapsulating structure 10 is not limited in the present application either.

The plating layer 1 includes a first metal layer 3 and a second metal layer 4 arranged in sequence: materials used for the first metal layer 3 and the second metal layer 4 are different. Among them, thicknesses of the first metal layer 3 and the second metal layer 4 may be the same or not: areas of the first metal layer 3 and the second metal layer 4 may be the same or not.

Optionally, the plating layer 1 may be grid-shaped, that is, the first metal layer 3 and the second metal layer 4 are both grid-shaped, so that a cost of the plating layer 1 can be saved.

In another implementation, the chip heat dissipating structure further includes a heat sink 2, where the plating layer 1 is covered on the chip, that is, the plating layer 1 is covered on the wafer 8 and the plastic encapsulating structure 10: the heat sink 2 and the plating layer 1 are connected, where the heat sink 2 and the plating layer 1 are connected by soldering.

A shape and a size of the heat sink 2 are not limited in the present application.

Figure 4:
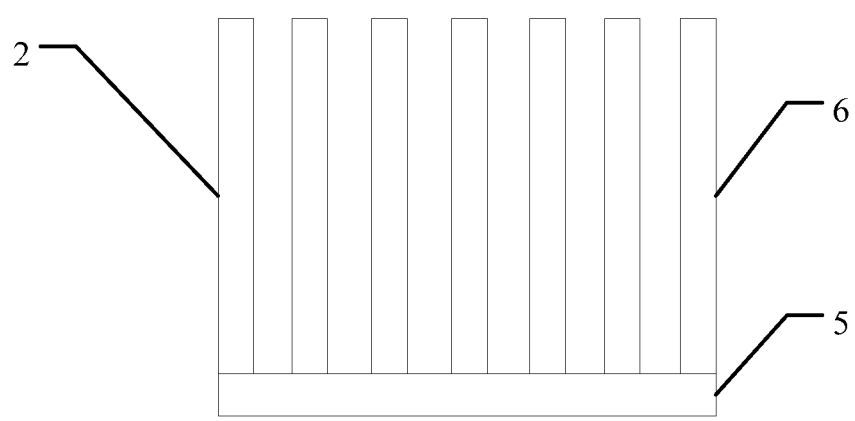
FIG. 4 is a structural schematic diagram I of a heat sink provided by an embodiment of the present application.

For example, FIG. 4 is a structural schematic diagram I of a heat sink provided by an embodiment of the present application. As shown in FIG. 4, the heat sink 2 is composed of a bottom plate 5 and at least one dissipating fin 6, and each dissipating fin 6 is fixedly connected to the bottom plate 5, and the bottom plate 5 is soldered to a surface of the plating layer 1.

Figure 5:
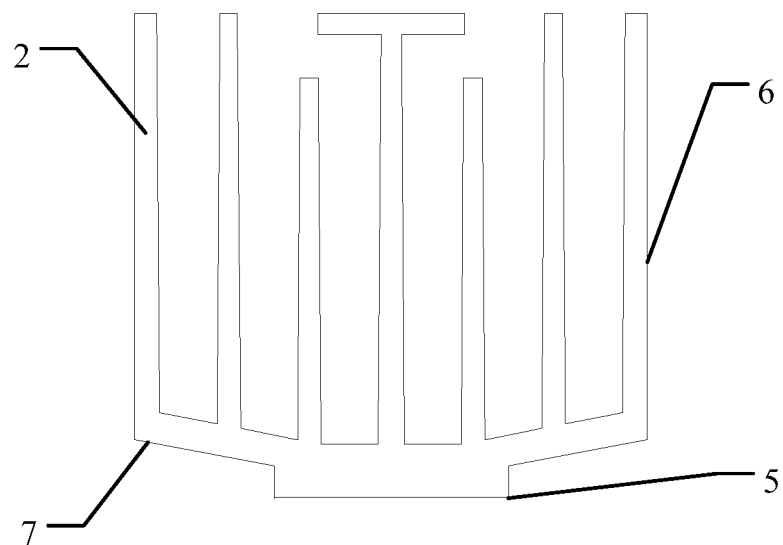
FIG. 5 is a structural schematic diagram II of a heat sink provided by an embodiment of the present application.

For another example, FIG. 5 is a structural schematic diagram II of a heat sink provided by an embodiment of the present application. As shown in FIG. 5, a connecting portion 7 may also be arranged on the heat sink 2, the connecting portion 7 is composed of a first plate and a second plate, and there is a preset angle between the first plate and the second plate, the preset angle may be in a range of 180 degrees to 90 degrees: furthermore, each dissipating fin 6 is fixedly arranged on an upper surface of the connecting portion 7, the bottom plate 5 is fixedly arranged on a lower surface of the connecting portion 7: moreover, a gripper may be arranged on one of the dissipating fins 6 of the heat sink.

In this embodiment, by providing a chip heat dissipating structure composed of a plating layer 1, the chip heat dissipating structure is used to be arranged on the chip, and the plating layer 1 is covered on a wafer 8 and a plastic encapsulating structure 10 of the chip, where the plating layer 1 includes a first metal layer 3 and a second metal layer 4 arranged in sequence: furthermore, a heat sink 2 may be connected to the plating layer 1. Since two metal layers are added on the top of the chip by physical sputtering, the heat sink may be soldered onto the metal layer through a solder layer, so that the heat sink is fixed to the top of the chip: the main component of the solder layer is metal tin, and the metal layer has a higher thermal conductivity than an epoxy resin material mounted on a traditional heat sink, thereby solving a problem of the heat dissipation bottleneck of a resin material in the chip, thus improving a heat dissipation effect of the chip and preventing a large amount of heat from damaging the chip.

Figure 6:
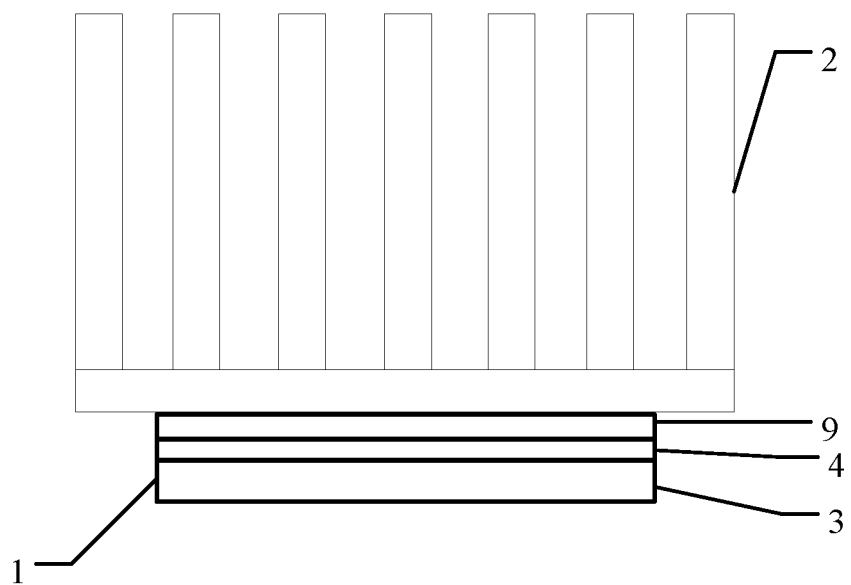
FIG. 6 is a structural schematic diagram I of another chip heat dissipating structure provided by an embodiment of the present application.
Figure 7:
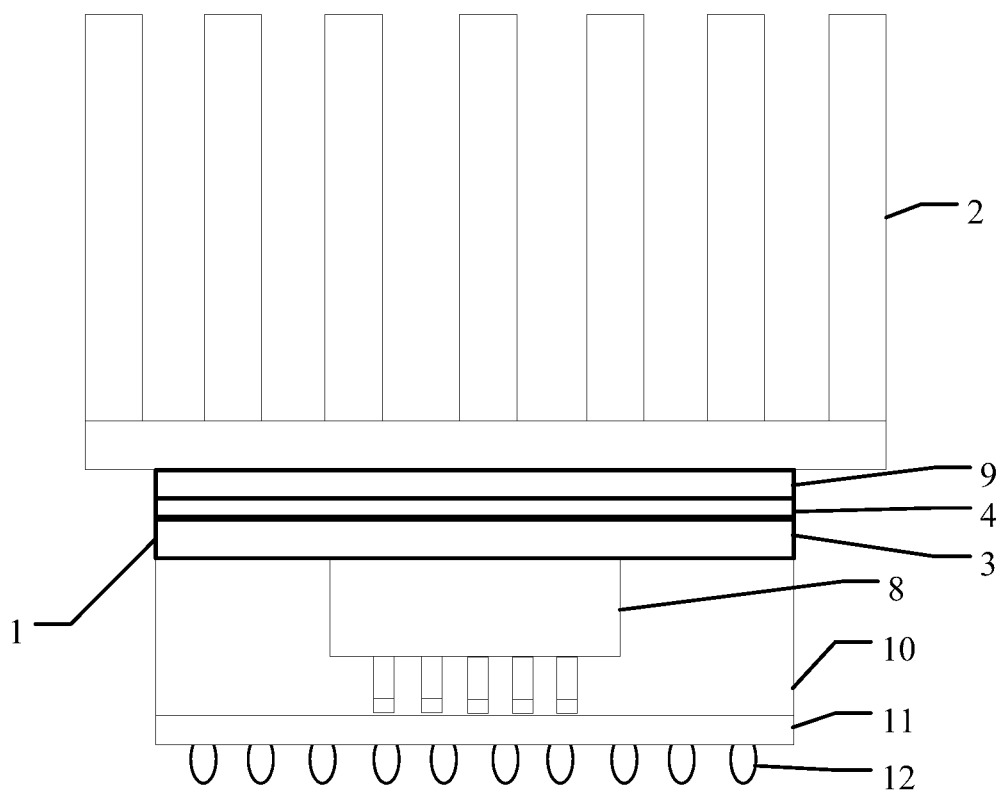
FIG. 7 is a structural schematic diagram II of another chip heat dissipating structure provided by an embodiment of the present application.

FIG. 6 is a structural schematic diagram I of another chip heat dissipating structure provided by an embodiment of the present application: FIG. 7 is a structural schematic diagram II of another chip heat dissipating structure provided by an embodiment of the present application: on the basis of the embodiments shown in FIG. 1, as shown in FIG. 6 and FIG. 7, the first metal layer 3 is covered on the chip, and the second metal layer 4 is covered on the first metal layer 3.

Optionally, an area of the plating layer 1 is the same as an area of an upper surface of the chip.

Optionally, the first metal layer 3 is an alloy metal layer. A thickness of the first metal layer is 0.1-0.5 microns.

Optionally, the second metal layer 4 is a copper metal layer. A thickness of the second metal layer is 2-6 microns.

Optionally, an area of the first metal layer 3 is the same as an area of the second metal layer 4.

Optionally, the heat sink 2 is soldered onto the plating layer 1 through a solder layer 9.

Optionally, a solder in the solder layer 9 is tin. A thickness of the solder layer 9 is 0.1-0.15 millimeters.

Optionally, an area of the solder layer 9 is the same as area of the plating layer 1, or an area of the solder layer 9 is the same as an area of a lower surface of the heat sink 2.

Optionally, if an upper surface of the wafer 8 is flush with an upper surface of the plastic encapsulating structure 10, the plating layer 1 is a plating layer 1 with a uniform thickness: if the upper surface of the wafer 8 is lower than the upper surface of the plastic encapsulating structure 10, the plating layer 1 is embedded in the plastic encapsulating structure 10; and if the upper surface of the wafer 8 is higher than the upper surface of the plastic encapsulating structure 10, the wafer 8 is embedded in the plating layer 1.

Exemplarily, on the basis of the embodiments shown in FIG. 1, the first metal layer 3 is covered on the upper surfaces of the wafer 8 and the plastic encapsulating structure 10, and the second layer 4 is covered on an upper surface of the first metal layer 3.

In this embodiment, a material of the first metal layer 3 is an alloy, that is, the first metal layer 3 is an alloy metal layer, for example, the alloy is a stainless steel (SUS); and a material of the second metal layer 4 is a copper, that is, the second metal layer 4 is an alloy metal layer, in this way, the alloy metal layer is covered on the upper surfaces of the wafer 8 and the plastic encapsulating structure 10, and the copper metal layer is covered on an upper surface of the alloy metal layer.

In order to facilitate the connection of the two metal layers to the chip and the heat sink 2, and to facilitate a heat conduction of the two metal layers and the heat dissipation of the chip, thicknesses of the above two metal layers may be set to the following parameters: a thickness of the first metal layer 3 is 0.1-0.5 microns, preferably, the thickness of the first metal layer 3 is 0.15 microns; and a thickness of the second metal layer 4 is 2-6 microns, preferably, the thickness of the second metal layer 4 is 3 microns.

In this embodiment, a solder layer is provided on the plating layer 1, that is, a solder layer 9 is provided on the second metal layer 4; and the heat sink 2 and the solder layer 9 are soldered together. A material of the solder layer 9 is tin. Optionally, a thickness of the solder layer 9 is 0.1-0.15 millimeters: preferably, the thickness of the solder layer 9 is 0.13 millimeters. A thermal conductivity of the solder layer 9 is higher than 60 W/(m·C), which can improve the heat dissipation effect of the chip.

Figure 8:
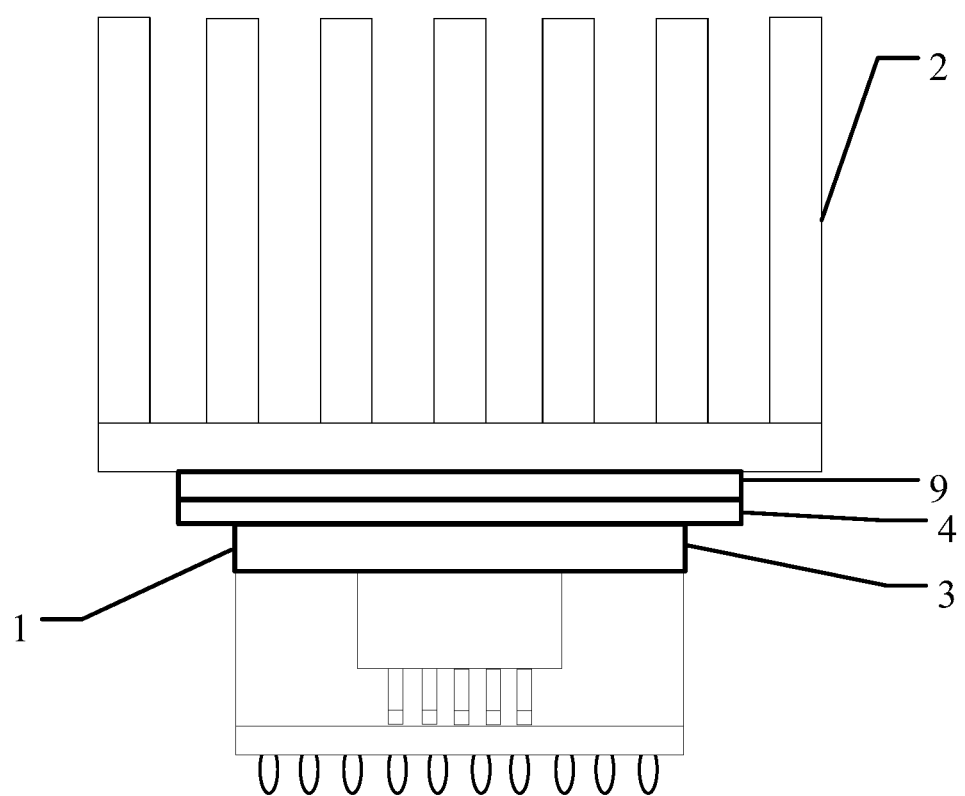
FIG. 8 is a structural schematic diagram III of another chip heat dissipating structure provided by an embodiment of the present application.

In this embodiment, the area of the plating layer 1 is the same as the area of the upper surface of the chip, that is, the area of the plating layer 1 is equal to a sum of the area of the upper surface of the wafer 8 and the area of the upper surface of the plastic encapsulating structure 10; at this time, the area of the first metal layer 3 is the same as the area of the upper surface of the chip. As shown in FIG. 7, the area of the first metal layer 3 is the same as the area of the upper surface of the chip, and the area of the first metal layer 3 is the same as the area of the second metal layer 4: alternatively, FIG. 8 is a structural schematic diagram III of another chip heat dissipating structure provided by an embodiment of the present application, as shown in FIG. 8, the area of the first metal layer 3 is the same as the area of the upper surface of the chip, while the area of the first metal layer 3 is different from the area of the second metal layer 4.

In this embodiment, regarding the area of the solder layer 9, the following implementations are provided.

An implementation I of the area of the solder layer 9: as shown in FIG. 7, the area of the first metal layer 3 is the same as the area of the second metal layer 4, and the area of the solder layer 9 is the same as the area of the plating layer 1.

Figure 9:
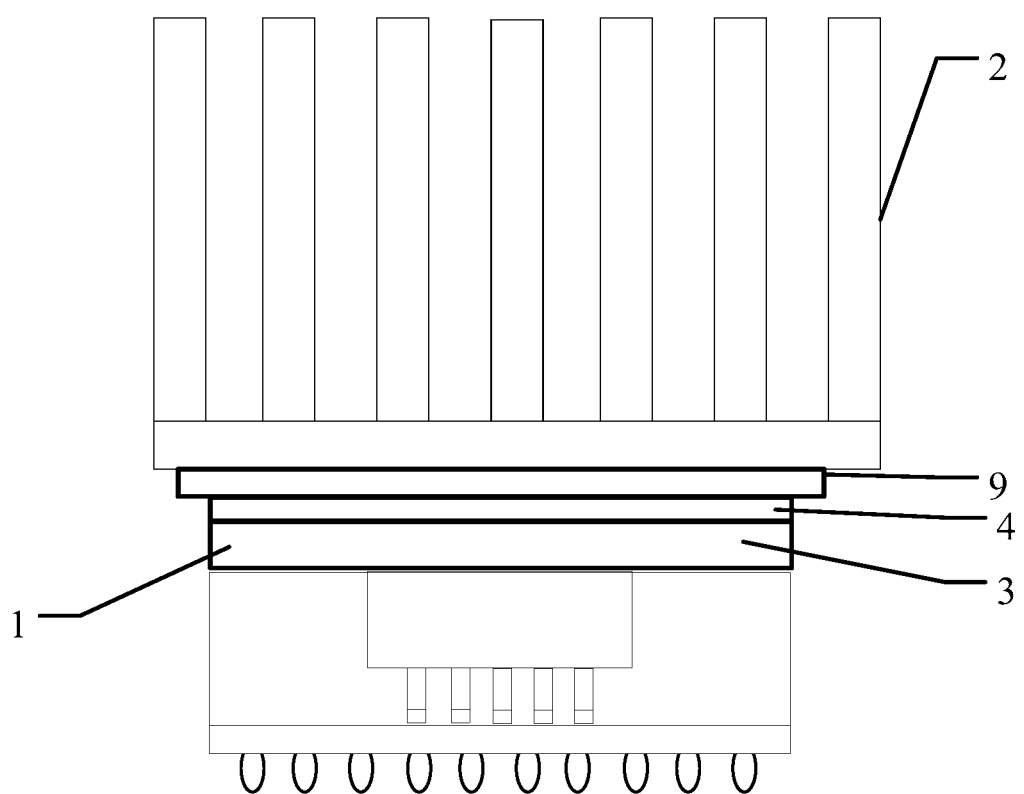
FIG. 9 is a structural schematic diagram IV of another chip heat dissipating structure provided by an embodiment of the present application.

An implementation II of the area of the solder layer 9: FIG. 9 is a structural schematic diagram IV of another chip heat dissipating structure provided by an embodiment of the present application, as shown in FIG. 9, the area of the first metal layer 3 is the same as the area of the second metal layer 4, while the area of the solder layer 9 is different from the area of the plating layer 1.

Figure 10:
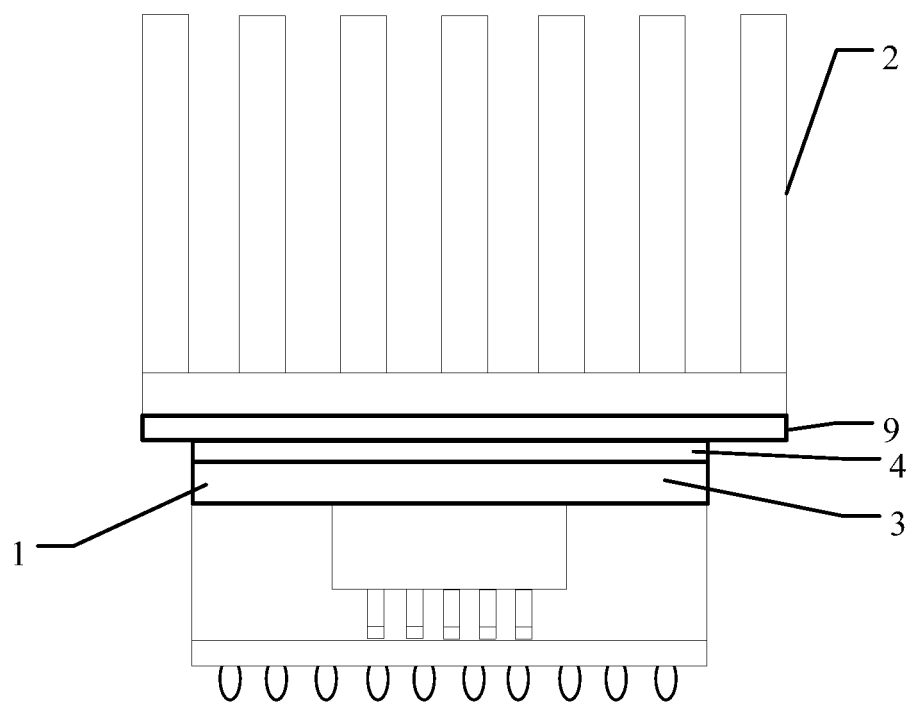
FIG. 10 is a structural schematic diagram V of another chip heat dissipating structure provided by an embodiment of the present application.

An implementation III of the area of the solder layer 9: FIG. 10 is a structural schematic diagram V of another chip heat dissipating structure provided by an embodiment of the present application, as shown in FIG. 10, the area of the first metal layer 3 is the same as the area of the second metal layer 4, and the area of the solder layer 9 is the same as the area of the lower surface of the heat sink 2: where the area of the solder layer 9 is different from the area of the plating layer 1. The area of the solder layer 9 is the same as the area of a bottom surface of the heat sink 2, thus facilitating a good connection between the heat sink 2 and the solder layer 9.

Figure 11:
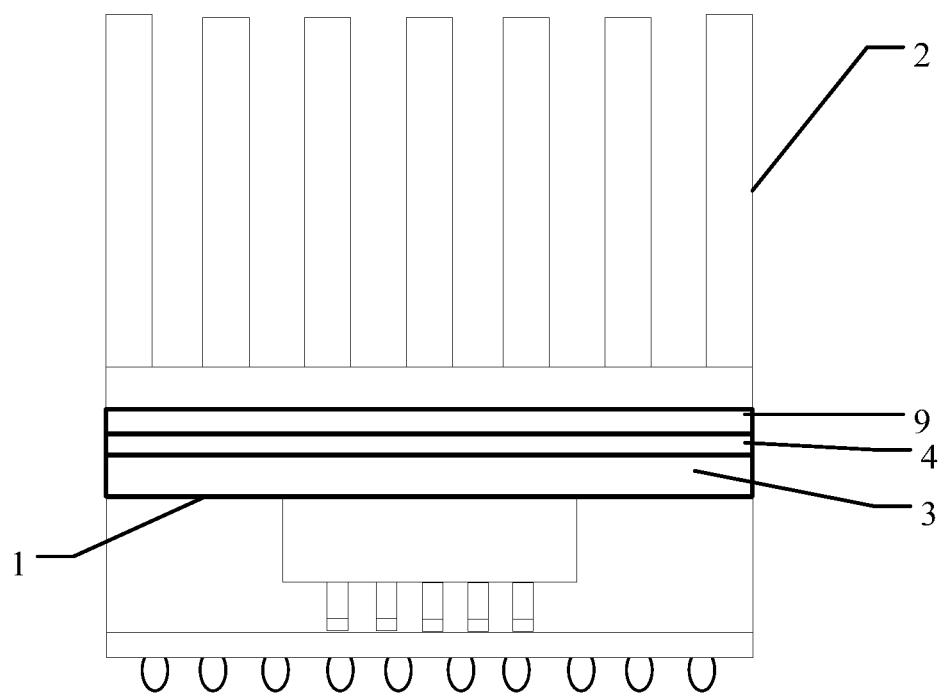
FIG. 11 is a structural schematic diagram VI of another chip heat dissipating structure provided by an embodiment of the present application.

An implementation IV of the area of the solder layer 9: FIG. 11 is a structural schematic diagram VI of another chip heat dissipating structure provided by an embodiment of the present application, as shown in FIG. 11, the area of the first metal layer 3 is the same as the area of the second metal layer 4, and the area of the solder layer 9 is the same as the area of the lower surface of the heat sink 2: where the area of the solder layer 9 is the same as the area of the plating layer 1.

Regarding a positional relationship between the plating layer 1 and the chip, the following implementations are provided.

Figure 12:
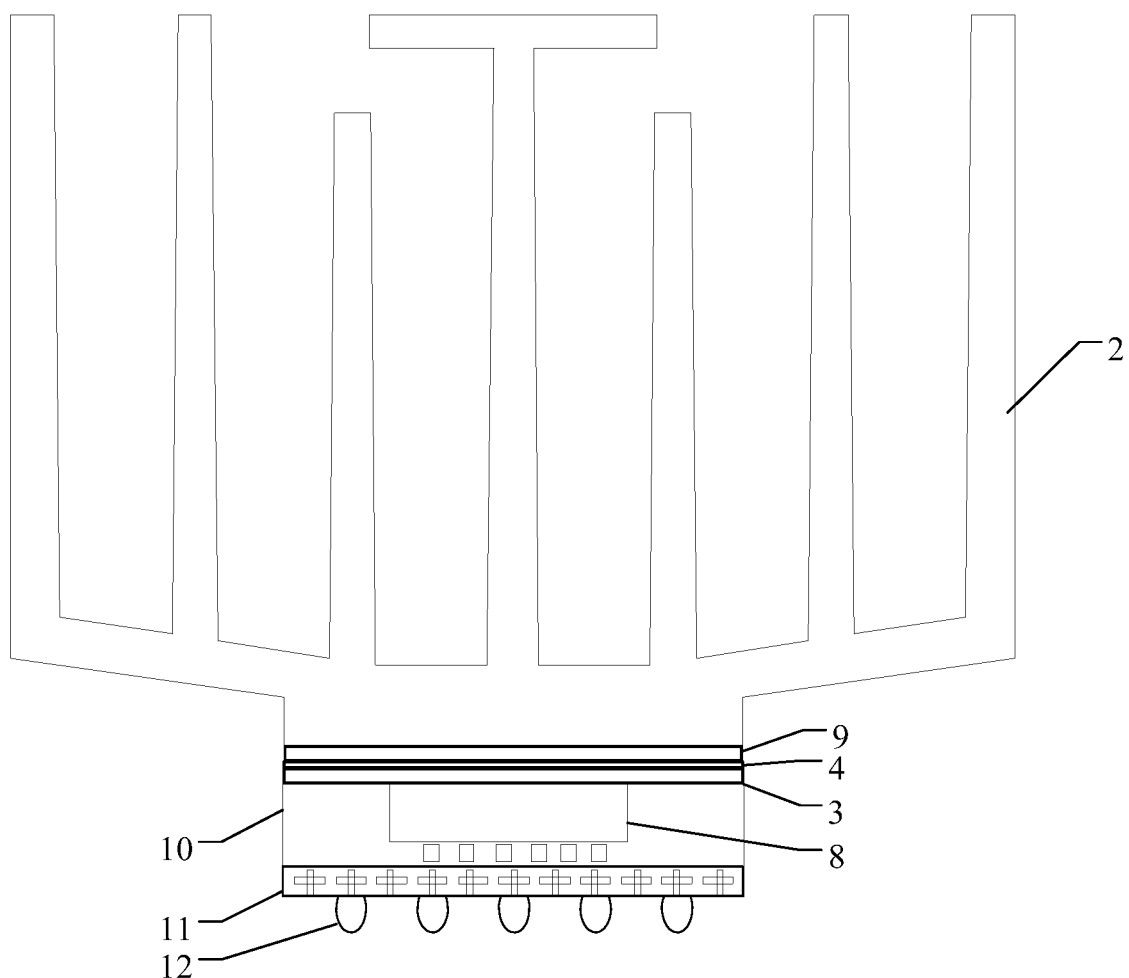
FIG. 12 is a structural schematic diagram VII of another chip heat dissipating structure provided by an embodiment of the present application.

An implementation I of the positional relationship between the plating layer 1 and the chip: FIG. 12 is a structural schematic diagram VII of another chip heat dissipating structure provided by an embodiment of the present application, as shown in FIG. 12, if an upper surface of the wafer 8 is flush with an upper surface of the plastic encapsulating structure 10, the plating layer 1 is a plating layer 1 with a uniform thickness.

Figure 13:
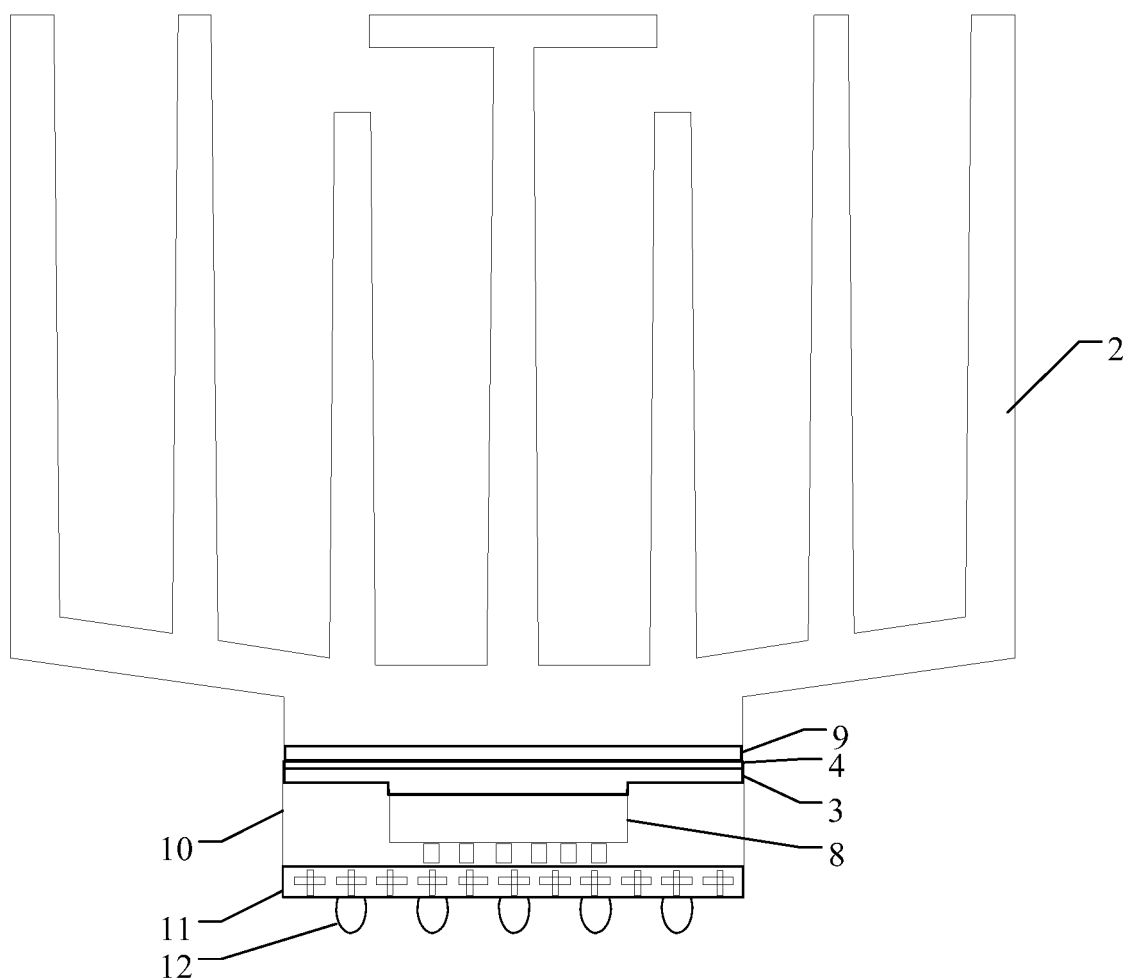
FIG. 13 is a structural schematic diagram of another chip heat dissipating structure provided by an embodiment of the present application.

An implementation II of the positional relationship between the plating layer 1 and the chip: FIG. 13 is a structural schematic diagram VIII of another chip heat dissipating structure provided by an embodiment of the present application, as shown in FIG. 13, if an upper surface of the wafer 8 is lower than an upper surface of the plastic encapsulating structure 10, a thickness of the plating layer 1 is not uniform, and the first metal layer 3 of the plating layer 1 is embedded in a groove of the plastic encapsulating structure 10.

Figure 14:
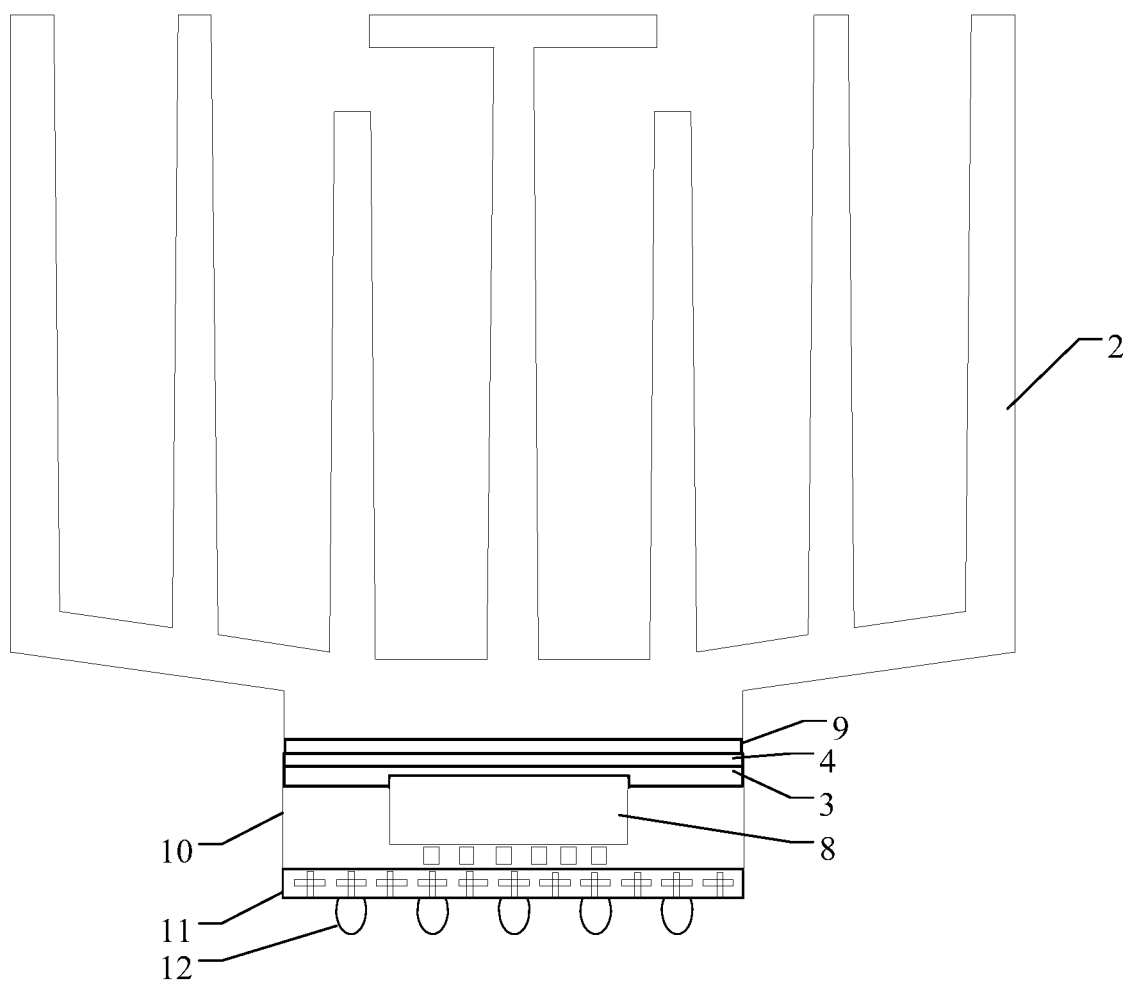
FIG. 14 is a structural schematic diagram IX of another chip heat dissipating structure provided by an embodiment of the present application.

An implementation III of the positional relationship between the plating layer 1 and the chip: FIG. 14 is a structural schematic diagram IX of another chip heat dissipating structure provided by an embodiment of the present application, as shown in FIG. 14, if an upper surface of the wafer 8 is higher than an upper surface of the plastic encapsulating structure 10, a thickness of the plating layer 1 is not uniform, the wafer 8 is embedded in the first metal layer 3 of the plating layer 1.

In this embodiment, a process of obtaining the chip heat dissipating structure is the following process.

Step I, Dicing the Wafer.

Figure 15:
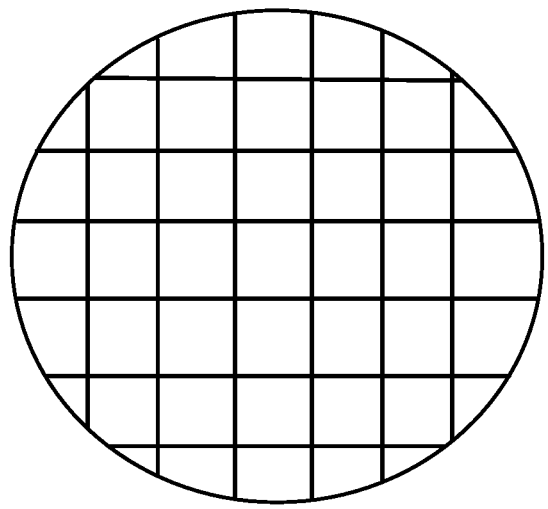
FIG. 15 is a structure schematic diagram of a diced wafer provided by an embodiment of the present application.

FIG. 15 is a structure schematic diagram of a diced wafer provided by an embodiment of the present application. As shown in FIG. 15, the wafer 8 is firstly diced to obtain the diced wafer 8 as shown in FIG. 15.

Step II, Mounting the Wafer.

Figure 16:
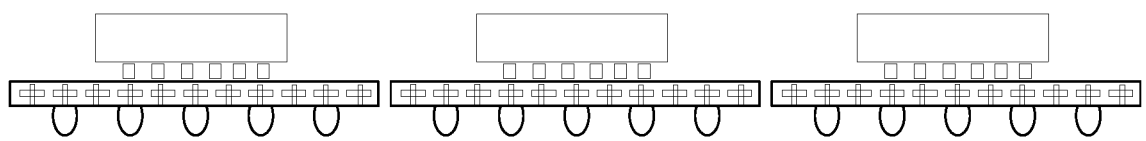
FIG. 16 is a process flow schematic diagram I of a chip provided by an embodiment of the present application.

FIG. 16 is a process flow schematic diagram I of a chip provided by an embodiment of the present application. As shown in FIG. 16, the diced wafer 8 is respectively mounted on the substrate 11 of each chip.

Step III, Plastic-Encapsulating the Chip.

Figure 17:
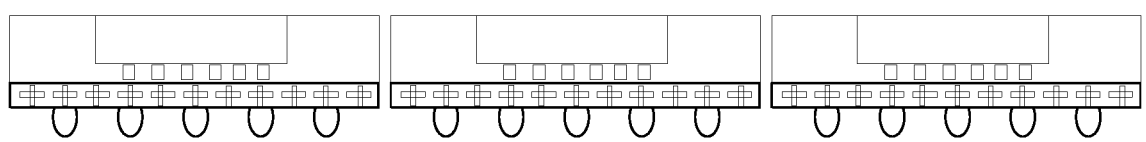
FIG. 17 is a process flow schematic diagram II of a chip provided by an embodiment of the present application.

FIG. 17 is a process flow schematic diagram II of a chip provided by an embodiment of the present application. As shown in FIG. 17, the wafer 8 on each substrate 11 is plastic-encapsulated, that is, the wafer 8 is plastic-encapsulated by the plastic encapsulating structure 10.

Step IV, Mounting a Tape.

Figure 18:
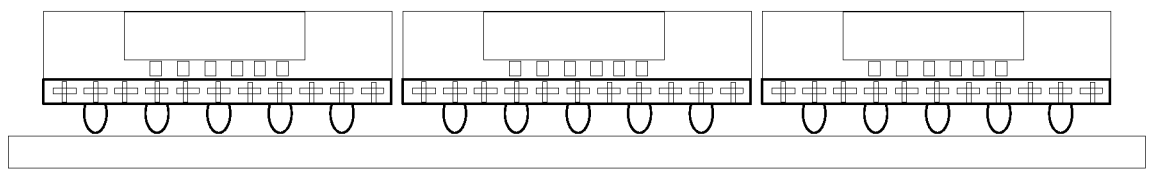
FIG. 18 is a process flow schematic diagram III of a chip provided by an embodiment of the present application.

FIG. 18 is a process flow schematic diagram III of a chip provided by an embodiment of the present application. As shown in FIG. 18, each chip shown in FIG. 17 is provided with a tape mount, and strip loading is performed.

Step V, Setting Metal Layers.

Figure 19:
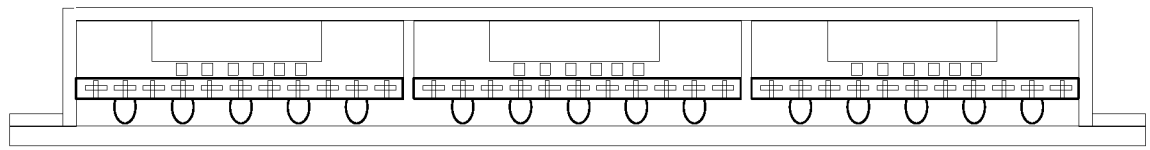
FIG. 19 is a process flow schematic diagram IV of a chip provided by the embodiment of the present application.

FIG. 19 is a process flow schematic diagram IV of a chip provided by the embodiment of the present application. As shown in FIG. 19, the first metal layer 3 and the second metal layer 4 are sequentially arranged on the upper surface of the chip by physical sputtering or electroplating.

Step VI, Peeling and Unloading.

Figure 20:
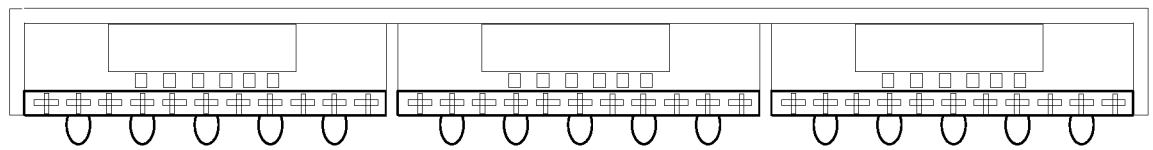
FIG. 20 is a process flow schematic diagram V of a chip provided by an embodiment of the present application.

FIG. 20 is a process flow schematic diagram V of a chip provided by an embodiment of the present application. As shown in FIG. 20, the strip under the chip is removed.

Step VII, Separation Processing.

Figure 21:
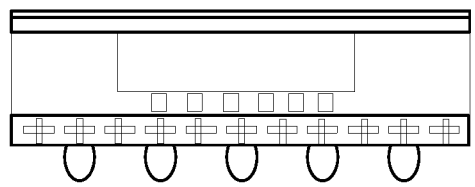
FIG. 21 is a process flow schematic diagram VI of a chip provided by the embodiment of the present application.

FIG. 21 is a process flow schematic diagram VI of a chip provided by an embodiment of the present application. As shown in FIG. 21, strip singulation processing is performed on a respective chip to obtain the chip.

Step VIII, Soldering a Solder.

A solder layer 9 may be arranged on the second metal layer 4 of the plating layer 1, so that the heat sink 2 and the solder layer 9 may be soldered together.

In this embodiment, by providing a chip heat dissipating structure composed of a plating layer 1, the chip heat dissipating structure is used to be arranged on the chip, the plating layer 1 is covered on a wafer 8 and a plastic encapsulating structure 10 of the chip, and a heat sink 2 is connected to the plating layer 1 via a solder layer 9: where the plating layer 1 includes a first metal layer 3 and a second metal layer 4 arranged in sequence: the first metal layer 3 is covered on the wafer 8 and the plastic encapsulating structure 10, and the second metal layer 4 is covered on the first metal layer 3. By adding two metal layers on the top of the chip by physical sputtering, the heat sink 2 may be soldered onto the metal layer through the solder layer, so that the heat sink 2 is fixed to the top of the chip: the main component of the solder layer is metal tin, and the metal layer has a higher thermal conductivity than an epoxy resin material mounted on a traditional heat sink, thereby solving a problem of the heat dissipation bottleneck of a resin material in the chip: the metal layer and the solder layer 9 further accelerate the heat dissipation of the chip, hence improving a heat dissipation effect of the chip and preventing a large amount of heat from damaging the chip.

Figure 22:
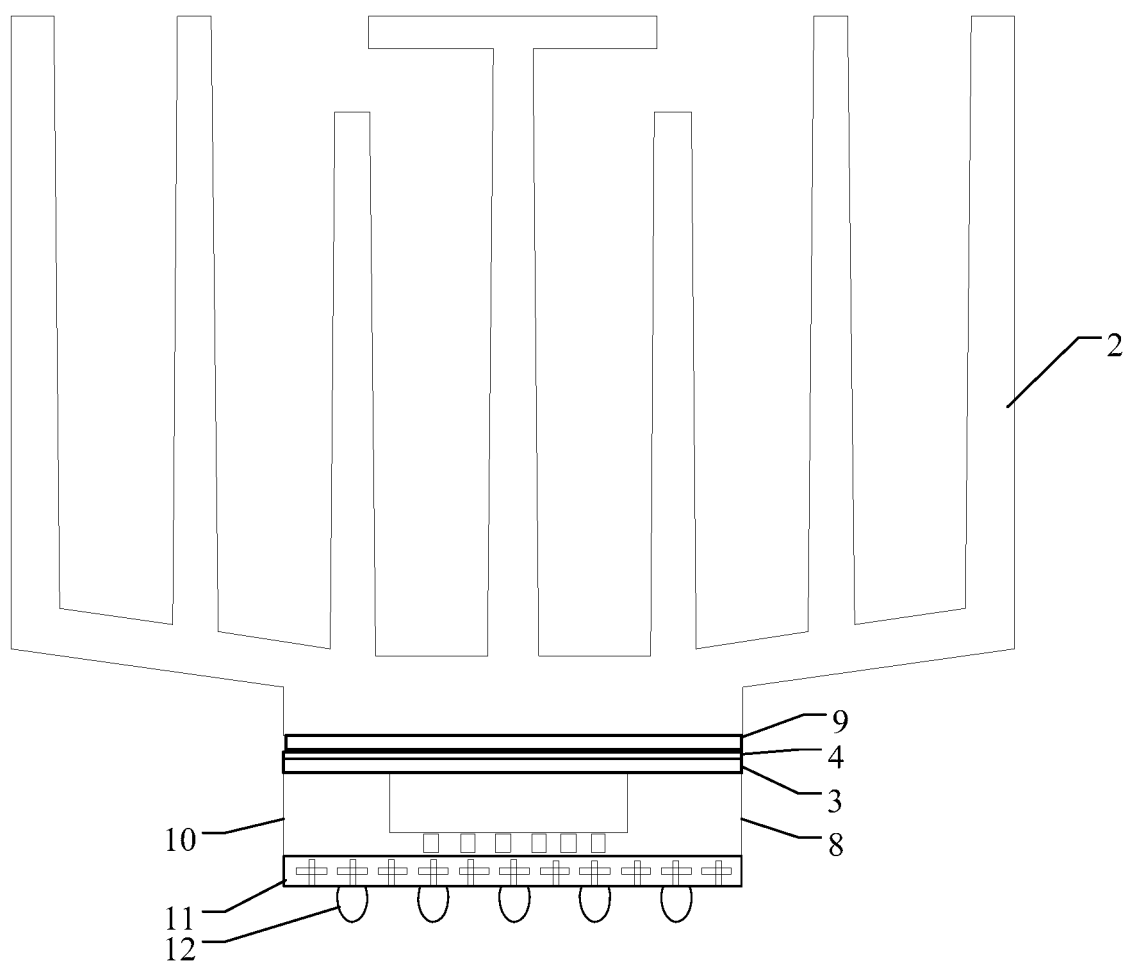
FIG. 22 is a structural schematic diagram I of a chip structure provided by an embodiment of the present application.
Figure 23:
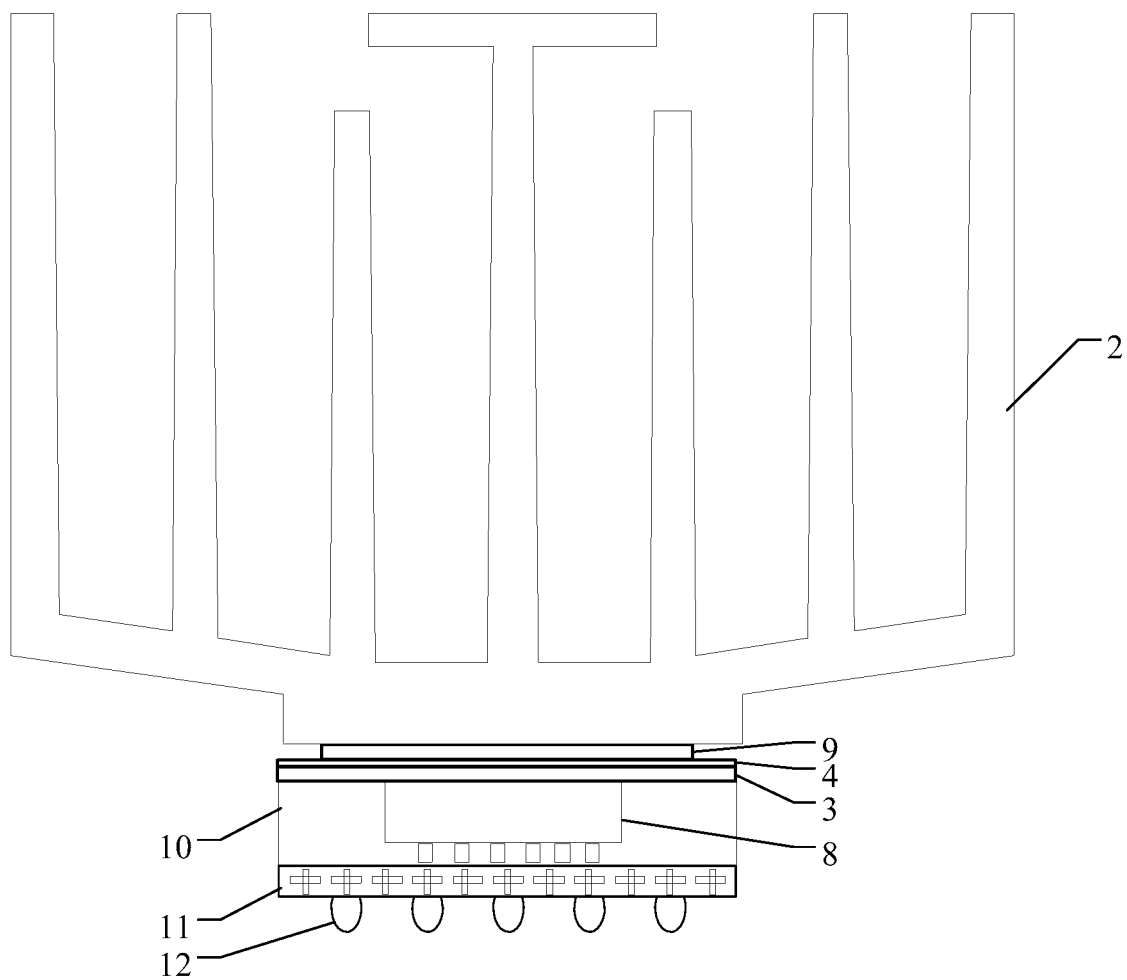
FIG. 23 is a structural schematic diagram II of a chip structure provided by an embodiment of the present application.

FIG. 22 is a structural schematic diagram I of a chip structure provided by an embodiment of the present application: FIG. 23 is a structural schematic diagram II of a chip structure provided by an embodiment of the present application: as shown in FIG. 22 and FIG. 23, the chip structure includes a chip body and a chip heat dissipating structure arranged on the chip body, where the chip heat dissipating structure adopts the chip heat dissipating structure provided in the above-mentioned embodiments.

Exemplarily, the chip body includes a wafer 8, a plastic encapsulating structure 10 and a substrate 11: a groove is arranged on the plastic encapsulating structure 10, and the wafer 8 may be arranged in the groove, and then the plastic encapsulating structure 10 is used to encapsulate the wafer 8 and an upper surface of the wafer 8 is exposed: the plastic encapsulating structure 10 is fixedly arranged on one side of the substrate 11: furthermore, at least one solder ball 12 may be arranged on the other side of the substrate 11, and the solder ball 12 is used to connect with a circuit board, so as to fix the chip on the circuit board.

Then, the chip heat dissipating structure provided in the above-mentioned embodiments is arranged on the chip body, and the plating layer 1 of the chip heat dissipating structure is arranged on the wafer 8 and the plastic encapsulating structure 10 of the chip body. The structure and principle of the chip heat dissipating structure may be referred to the above-mentioned embodiments, which will not be repeated.

In this embodiment, at least one hole may be opened on the plastic encapsulating structure 10: one or more of the at least one hole is provided with a thermally conductive structure. Optionally, the thermally conductive structure is a metal thermally conductive structure or a non-metal thermally conductive structure. Thus, by opening a hole on the plastic encapsulating structure 10 and providing a thermally conductive structure in the hole, the chip structure can be further dissipated.

For example, a material of the metal thermally conductive structure includes at least one or more of copper, aluminum, silver, tin, gold, iron, and aluminum alloy. A material of the non-metal thermally conductive structure includes at least one or more of resin, ceramic, graphite, graphene, and water.

In this embodiment, the chip heat dissipating structure provided in the above-mentioned embodiments is arranged on the chip body. A chip heat dissipating structure composed of a plating layer 1 is provided, the chip heat dissipating structure is used to be arranged on the chip, and the plating layer 1 is covered on a wafer 8 and a plastic encapsulating structure 10 of the chip, where the plating layer 1 includes a first metal layer 3 and a second metal layer 4 arranged in sequence: furthermore, a heat sink 2 may be connected to the plating layer 1. By adding two metal layers on the top of the chip by physical sputtering, the heat sink may be soldered onto the metal layer through a solder layer, so that the heat sink is fixed to the top of the chip: the main component of the solder layer is metal tin, and the metal layer has a higher thermal conductivity than an epoxy resin material mounted on a traditional heat sink, thereby solving a problem of the heat dissipation bottleneck of a resin material in the chip, hence improving a heat dissipation effect of the chip and preventing a large amount of heat from damaging the chip.

Figure 24:
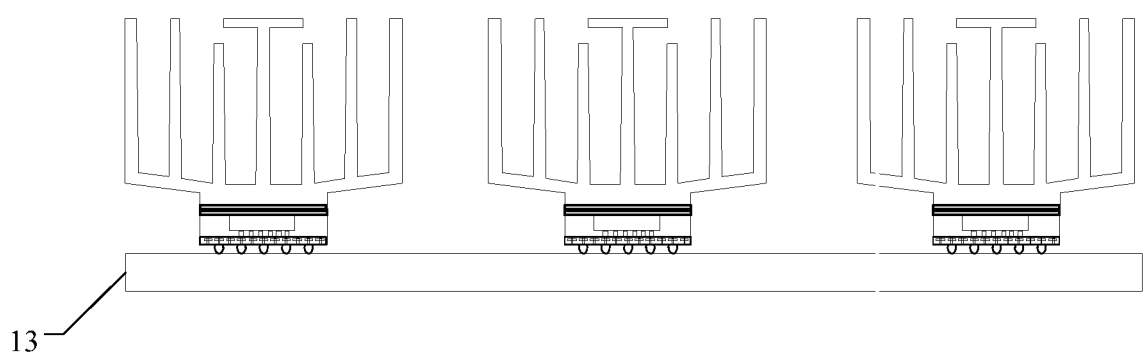
FIG. 24 is a structure schematic diagram of a circuit board provided by an embodiment of the present application.

FIG. 24 is a structure schematic diagram of a circuit board provided by an embodiment of the present application, as shown in FIG. 24, the circuit board 13 of the embodiment of the present application is provided with at least one chip structure of the above-mentioned embodiments.

Exemplarily, the circuit board 13 is provided with at least one chip structure of the above-mentioned embodiments, and the chip structure and a solder ball are fixedly connected to the circuit board 13.

A position and the number of chip structures on the circuit board 13 are not limited. For example, at least one chip structure may be arranged on an upper surface of the circuit board 13: alternatively, at least one chip structure may be arranged on an upper surface of the circuit board 13, and at least one chip structure may be arranged on a lower surface of the circuit board 13.

The specific structure of the chip structure on the circuit board 13 may be the same or not. For example, the upper surface of the wafer in one chip structure on the circuit board 13 is flush with the upper surface of the plastic encapsulating structure, and the upper surface of the wafer in another chip structure on the circuit board 13 is lower than the upper surface of the plastic encapsulating structure.

Among them, the structure and principle of the chip structure may be referred to the above-mentioned embodiments, which will not be repeated.

In this embodiment, by providing at least one chip structure of the above-mentioned embodiments on a circuit board 13, and the chip structure is provided with the chip heat dissipating structure provided by the above-mentioned embodiments. By adding two metal layers on the top of the chip by physical sputtering, the heat sink may be soldered onto the metal layer through a solder layer, so that the heat sink is fixed to the top of the chip: the main component of the solder layer is metal tin, and the metal layer has a higher thermal conductivity than an epoxy resin material mounted on a traditional heat sink, thereby solving a problem of the heat dissipation bottleneck of a resin material in the chip, hence improving a heat dissipation effect of the chip and preventing a large amount of heat from damaging the chip. Furthermore, the circuit board 13 is dissipated to prevent heat from damaging the circuit board 13 and components on the circuit board 13.

Figure 25:
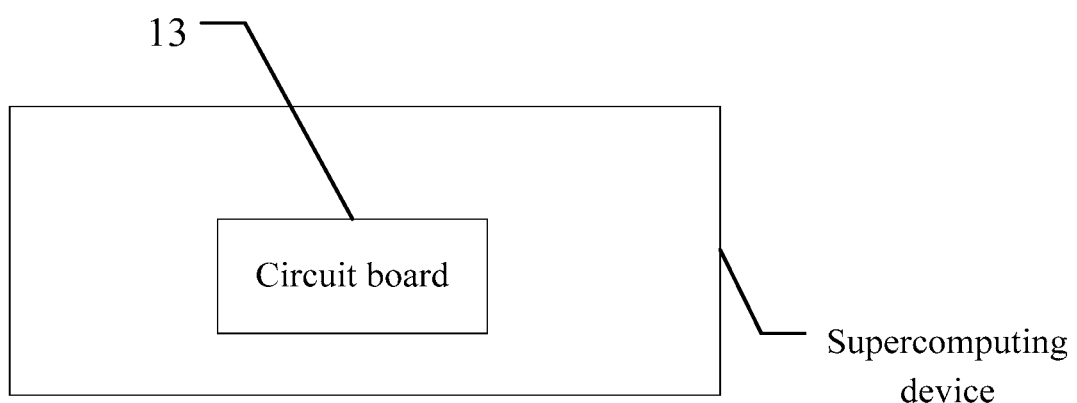
FIG. 25 is a structural schematic diagram of a supercomputing device provided by an embodiment of this application.

FIG. 25 is a structural schematic diagram of a supercomputing device provided by an embodiment of this application, as shown in FIG. 25, the supercomputing device provided in an embodiment of the present application is provided with at least one circuit board 13 provided in the above-mentioned embodiments.

Optionally, circuit boards 13 in the supercomputing device are connected in parallel with each other.

Optionally, a sliding groove may be provided on a case of the supercomputing device, the sliding groove is used for slidable connection with each circuit board 13 in the supercomputing device.

Optionally, fans may also be arranged on both sides of the case of the supercomputing device, and a heat dissipation air duct of the fan may be consistent with a heat dissipating chamber of a heat sink on the circuit board 13, so as to quickly dissipate the heat generated by the circuit board 13 in the case to the outside of the case, thereby providing a performance of supercomputing device.

Exemplarily, one or more circuit boards 13 are arranged in the supercomputing device, and the circuit board 13 adopts the circuit boards 13 provided in the above-mentioned embodiments. The structure and function of the circuit board 13 may be referred to the introduction of the above-mentioned embodiments, which will not be repeated.

In this embodiment, multiple circuit boards 13 may be connected in parallel, and then the parallel circuit boards 13 may be arranged in the supercomputing device. In one implementation, the supercomputing device may be a supercomputing server.

A connection between the circuit board 13 and the supercomputing device may be a fixed connection or slidable connection. Exemplarily, one or more sliding grooves may be arranged on the case of the supercomputing device, and then the circuit board 13 is arranged in the sliding groove, so that the circuit board 13 may slide on the sliding groove.

Among them, when multiple circuit boards 13 are arranged in the supercomputing device, the structure of each circuit board 13 of the multiple circuit boards 13 may be the same or not.

Each circuit board 13 is provided with at least one chip structure of the above-mentioned embodiments, and the chip structure and a solder ball are fixedly connected to the circuit board 13.

Among them, the structure and principle of the chip structure may be referred to the above-mentioned embodiments, which will not be repeated.

In this embodiment, by providing one or more circuit boards 13 of the above embodiments in a supercomputer device, at least one chip structure of the above embodiments is arranged on each circuit board 13, and the chip heat dissipating structure provided by the above embodiment is arranged on the chip structure. By adding two metal layers on the top of the chip by physical sputtering, the heat sink may be soldered onto the metal layer through a solder layer, so that the heat sink is fixed to the top of the chip: the main component of the solder layer is metal tin, and the metal layer has a higher thermal conductivity than an epoxy resin material mounted on a traditional heat sink, thereby solving a problem of the heat dissipation bottleneck of a resin material in the chip, hence improving a heat dissipation effect of the chip and preventing a large amount of heat from damaging the chip. Furthermore, the circuit board 13 is dissipated to prevent heat from damaging the circuit board 13 and components on the circuit board 13.

In the present application, although the terms "first", "second", etc. may be used in the present application to describe various elements, these elements should not be limited by these terms. These terms are only used to distinguish one element from another element. For example, without changing the meaning of the description, a first element may be called a second element, and likewise, a second element may be called a first element, as long as all occurrences of the "first element" are renamed consistently and all occurrences of the "second component" are renamed consistently. The first element and the second element are both elements, but they may not be the same element.

The terms used in the present application are only used to describe the embodiment but not used to limit the claim. For example, the singular forms "a", "an" and "the" used in the description of the embodiment and claim are intended to include plural forms unless limitation to the singular is explicitly stated. Similarly, the term "and/or" used in the present application refers to any and all possible combinations that include one or more of the associated lists. Furthermore, when used in this application, the term "comprise" and its variants "comprises" and/or "comprising" and the like refer to an existence of a stated feature, a whole, a step, an operation, an element, and/or a component, but does not exclude the existence or addition of one or more other features, wholes, steps, operations, elements, components, and/or groups of these.

The various aspects, implementations, realizations or features in the described embodiments can be used alone or in any combination.

The above technical description may refer to the drawings, which form a part of the present application, and the drawings show implementations in accordance with the described embodiments. Although these embodiments are described in sufficient detail to enable persons of ordinary skill in the art to implement these embodiments, these embodiments are non-limitative: so that other embodiments and changes may be used without departing from the scope of the described embodiments. For example, an order of operations described in the flowchart is non-limitative, so that the order of two or more operations illustrated in the flowchart and described according to the flowchart can be changed according to several embodiments. For another example, in several embodiments, one or more operations illustrated in the flowchart and described according to the flowchart are optional or can be deleted. Furthermore, certain steps or functions may be added to the disclosed embodiments, or the order of two or more steps may be replaced. All these changes are considered to be included in the disclosed embodiment and claim.

Furthermore, terms are used in the above technical description to provide a thorough understanding of the described embodiments. However, particular details are not required to implement the described embodiments. Therefore, the above description of the embodiments is presented for explanation and description. The embodiments presented in the above description and the examples disclosed according to these embodiments are provided separately, so that context may be added for facilitating understanding of the described embodiments. The above description is not intended to be exhaustive or to limit the described embodiments to the precise form of the present application. Based on the above teachings, several modifications, options and changes are feasible. In some cases, well-known processing steps are not described in detail to avoid unnecessarily affecting the described embodiments.

What is claimed is:

1. A chip heat dissipating structure arranged on a chip, the chip heat dissipating structure comprising a plating layer covered on the chip, wherein the plating layer comprises a first metal layer and a second metal layer arranged in sequence, and
wherein the chip heat dissipating structure further comprises a heat sink connected with the plating layer,
wherein the chip comprises a wafer and a plastic encapsulating structure, the plating layer is covered on the wafer and the plastic encapsulating structure of the chip, and an upper surface of the wafer is exposed, and
wherein the heat sink is soldered to the plating layer through a solder layer, the solder layer being disposed between the heat sink and the plating layer;
wherein a connecting portion is arranged on the heat sink, the connecting portion is composed of a first plate and a second plate, the first plate and the second plate are arranged at a preset angle, wherein the preset angle is in a range of 180 degrees to 90 degrees, and at least one dissipating fin is fixedly arranged on an upper surface of the connecting portion; and wherein the heat sink further comprises a bottom plate, the bottom plate is fixedly arranged on a lower surface of the connecting portion, and the bottom plate is soldered to a surface of the plating layer.

2. The chip heat dissipating structure according to claim 1, wherein the first metal layer is covered on the chip, and the second metal layer is covered on the first metal layer.

3. The chip heat dissipating structure according to claim 1, wherein an area of the plating layer is the same as an area of an upper surface of the chip.

4. The chip heat dissipating structure according to claim 1, wherein the first metal layer is an alloy metal layer.

5. The chip heat dissipating structure according to claim 4, wherein a thickness of the first metal layer is 0.1-0.5 microns.

6. The chip heat dissipating structure according to claim 1, wherein the second metal layer is a copper metal layer.

7. The chip heat dissipating structure according to claim 6, wherein a thickness of the second metal layer is 2-6 microns.

8. The chip heat dissipating structure according to claim 1, wherein an area of the first metal layer is the same as an area of the second metal layer.

9. The chip heat dissipating structure according to claim 1, wherein a solder in the solder layer is tin.

10. The chip heat dissipating structure according to claim 9, wherein a thickness of the solder layer is 0.1-0.15 millimeters.

11. The chip heat dissipating structure according to claim 1, wherein an area of the solder layer is the same as an area of the plating layer, or an area of the solder layer is the same as an area of a lower surface of the heat sink.

12. The chip heat dissipating structure according to claim 1, wherein, if an upper surface of the wafer is flush with an upper surface of the plastic encapsulating structure, the plating layer is a plating layer with a uniform thickness.

13. The chip heat dissipating structure according to claim 1,
wherein, if the upper surface of the wafer is lower than an upper surface of the plastic encapsulating structure, the plating layer is embedded in the plastic encapsulating structure; or
if the upper surface of the wafer is higher than the upper surface of the plastic encapsulating structure, the wafer is embedded in the plating layer.

14. A chip structure, comprising a chip body and the chip heat dissipating structure according to claim 1 substantially arranged on the chip body.

15. A circuit board, wherein at least one of the chip structure according to claim 14 is arranged on the circuit board.

16. A supercomputing device, wherein at least one of the circuit board according to claim 15 is arranged in the supercomputing device.

17. The chip heat dissipating structure according to claim 1, wherein the plating layer is in direct contact with the upper surface of the wafer.

* * * * *